(12) United States Patent
Kim et al.

(10) Patent No.: US 7,497,959 B2
(45) Date of Patent: Mar. 3, 2009

(54) METHODS AND STRUCTURES FOR PROTECTING ONE AREA WHILE PROCESSING ANOTHER AREA ON A CHIP

(75) Inventors: Deok-kee Kim, Wappingers Falls, NY (US); Kenneth T. Settlemyer, Jr., Poughquag, NY (US); Kangguo Cheng, Beacon, NY (US); Ramachandra Divakaruni, Ossining, NY (US); Carl J. Radens, Lagrangeville, NY (US); Dirk Pfeiffer, Dobbs Ferry, NY (US); Timothy Dalton, Ridgefield, NY (US); Katherina Babich, Chappaqua, NY (US); Arpan P. Mahorowala, Bronxville, NY (US); Harald Okorn-Schmidt, Klagenfurt (AT)

(73) Assignee: International Business Machines Corporation, Armonk, NY (US)

( * ) Notice: Subject to any disclaimer, the term of this patent is extended or adjusted under 35 U.S.C. 154(b) by 694 days.

(21) Appl. No.: 10/709,514

(22) Filed: May 11, 2004

(65) Prior Publication Data

US 2005/0255386 A1     Nov. 17, 2005

(51) Int. Cl.
  *H01B 3/00* (2006.01)
  *H01L 21/31* (2006.01)
  *H01L 49/00* (2006.01)
(52) U.S. Cl. .................. 216/17; 438/694; 257/618
(58) Field of Classification Search .............. 430/5; 438/694; 216/17; 257/618
  See application file for complete search history.

(56) References Cited

U.S. PATENT DOCUMENTS

| | | | | |
|---|---|---|---|---|
| 3,994,817 A | * | 11/1976 | Quintana | 252/79.3 |
| 4,049,347 A | * | 9/1977 | Smith, Jr. | 359/893 |
| 6,245,640 B1 | * | 6/2001 | Claussen et al. | 438/424 |
| 6,815,367 B2 | * | 11/2004 | Chen | 438/736 |
| 6,903,023 B2 | * | 6/2005 | Wise et al. | 438/705 |
| 7,077,903 B2 | * | 7/2006 | Babich et al. | 117/94 |
| 7,138,308 B2 | * | 11/2006 | Cheng et al. | 438/197 |
| 2004/0053504 A1 | * | 3/2004 | Wise et al. | 438/710 |
| 2005/0039681 A1 | * | 2/2005 | Fukiage | 118/723 E |
| 2005/0098091 A1 | * | 5/2005 | Babich et al. | 117/4 |
| 2005/0100682 A1 | * | 5/2005 | Fukiage et al. | 427/569 |
| 2005/0100683 A1 | * | 5/2005 | Fukiage et al. | 427/569 |
| 2005/0104150 A1 | * | 5/2005 | Wetzel et al. | 257/437 |
| 2005/0208434 A1 | * | 9/2005 | Mosden et al. | 430/323 |
| 2005/0221020 A1 | * | 10/2005 | Fukiage | 427/569 |
| 2005/0230677 A1 | * | 10/2005 | Wetzel et al. | 257/21 |
| 2006/0128055 A1 | * | 6/2006 | Cheng et al. | 438/83 |

FOREIGN PATENT DOCUMENTS

JP     2004004111958     *     4/2004

* cited by examiner

*Primary Examiner*—Evan Pert
(74) *Attorney, Agent, or Firm*—Whitman, Curtis, Christofferson & Cook, PC; Joseph P. Abate (57) ABSTRACT

Increased protection of areas of a chip are provided by both a mask structure of increased robustness in regard to semiconductor manufacturing processes or which can be removed with increased selectivity and controllability in regard to underlying materials, or both. Mask structures are provided which exhibit an interface of a chemical reaction, grain or material type which can be exploited to enhance either or both types of protection. Structures of such masks include TERA material which can be converted or hydrated and selectively etched using a mixture of hydrogen fluoride and a hygroscopic acid or organic solvent, and two layer structures of similar or dissimilar materials.

10 Claims, 6 Drawing Sheets

METHODS AND STRUCTURES FOR PROTECTING ONE AREA WHILE PROCESSING ANOTHER AREA ON A CHIP

BACKGROUND OF INVENTION

The present invention generally relates to manufacture of integrated circuits and, more particularly, to methods and structures which provide improved levels of protection for electronic device structures formed on a chip while processing the chip to form other electronic device structures.

Increased density and proximity of both active and passive electronic device structures in an integrated circuit have been recognized to provide benefits in both performance and functionality of integrated circuits. For example, reduced lengths of signal propagation paths allows operation at higher clock rates while reducing susceptibility to noise. Increased numbers of devices on a single chip also generally support such improved performance while allowing a greater number and variety of circuit functions to be provided such as local voltage regulation and conversion, local memory and additional logic circuitry or co-processors for microprocessors, non-volatile storage, redundant circuitry, self-test arrangements and many other types and combinations of circuits. Even entire systems can be provided on a single chip for increasing numbers of applications. As an additional benefit of increased integration density, an increased number of different functional circuits generally tends to reduce the number of external connections which must be made to a given chip; a requirement which has presented substantial difficulty in many chip designs.

However, such increases in integration density and performance requires that individual electronic device structures be substantially optimized, at least in groups, in accordance with the functions they must perform. For example, the storage cells of a memory, collectively referred to as the array section of a memory, require very different electronic device (e.g. transistor) properties and technologies from the transistor circuits necessary to decode and address and/or carry out reading, writing and refresh operations, collectively referred to as the support section of a memory. By the same token, devices in the support section differ substantially between dynamic, static and non-volatile memory structures as well as differing substantially from devices in logic arrays, processors and the like and may operate at very different voltages and clock speeds and require much different technologies and processes to manufacture. At the same time, electronic device structures of all types are becoming more delicate with smaller process tolerance windows. Therefore, it is imperative that robust protection be provided for some regions of a chip which may include devices which may be formed or partially formed thereon while processes unnecessary for or incompatible with devices in those regions are performed to provide devices of different design or function in another region of a chip.

At the present state of the art, while many materials, such as resists, and structures for providing protection to regions of the chip, often referred to as block-out masks, are known, these materials and structures are becoming marginal in the degree of protection provided in view of the reduced size and increased criticality and delicacy of current electronic device structures while requiring increased process complexity to form suitable block-out masks. Further, at current integration densities, the registration or overlay accuracy with which block-out masks can be formed is also becoming marginal. Moreover, more sophisticated technologies and materials choices are required in current electronic device designs and selectivity of processes between those materials and the materials of block-out masks is also becoming marginal. Additionally, direct process conflicts may arise from the heat budgets, process temperatures and topographies of integrated circuit structures, the integrity of block-out masks formed thereover and the complexity of block-out mask removal (since incomplete mask removal can result in significant compromise of manufacturing yield while extended processes for resist or mask removal, generally in the nature of etching, may damage structures previously protected by the mask). In other words, the protection provided by a mask structure must not only withstand semiconductor manufacturing processes while the mask is in place but must also include a mechanism of mask removal which is highly selective to underlying semiconductor material.

The physical processes by which resists function is also a source of problems as feature sizes become smaller. Consider that a resist must absorb exposure energy or particles in order to provide selective chemical reactions when developed which result in different material solubilities such that exposed or unexposed portions of the resist may be selectively removed. Therefore, the amount of exposure energy or particle flux diminishes with depth within a layer of resist and the energy or particle flux chosen for the exposure must be sufficient to provide effective exposure through the entire thickness of the resist layer. Scattering effects also occur within the resist layer thickness and reflective effects may occur at the surface on which the resist is applied; both of which tend to broaden the exposed regions. Scattering and reflection effects increase with increasing exposure energy or particle flux. Therefore, absorption and/or scattering/reflection effects imply that thinner resist layers must be used for smaller feature size regimes even though thinner resist layers are necessarily less robust and more subject to damage or being of reduced effectiveness to protect underlying materials as well as causing increased criticality of resist removal processes.

Accordingly, so-called hard masks have been developed in which a layer of material, preferably an anti-reflective coating (ARC) and containing silicon, and more chemically stable than a developed resist is deposited by a known process such as chemical vapor deposition (CVD) and then a thin resist layer is applied and patterned to allow the pattern in the thin resist layer to be transferred to the deposited layer by, for example, a plasma etch process, allowing the patterned deposited layer to function as a somewhat more robust mask. However, such materials are difficult to remove, particularly by wet stripping processes to which they are substantially inert; severely limiting their use in manufacturing and possibly damaging surfaces they otherwise should protect due to poor selectivity between mask and underlying materials of processing reactants in order to pattern or remove the block-out or hard mask structure. Further, while the separation of imaging and pattern transfer processes, even using traditional mask materials other than ARC materials, may engender some process flexibility, additional process steps and complexity are required.

In view of the increased criticality of mask structures to the manufacture of current and foreseeable integrated circuit designs at extremely high integration densities, at least improved levels of protection of underlying structures or improved selectivity and controllability of mask removal (and preferably both) must be achieved beyond the level of performance presently available from known mask materials and selective processes in order to sufficiently protect underlying materials during both semiconductor manufacturing processes and the subsequent removal of the mask structure.

As a practical matter, increased protection cannot be achieved by mere increase of mask thickness which may compromise lithographic exposures and/or chemical processes as well as mask removal.

SUMMARY OF INVENTION

It is therefore an object of the present invention to provide a thin but robust mask structure capable of producing fine lithographic features while providing improved protection of masked semiconductor surfaces and providing improved controllability, self-limitation and/or selectivity of processes to other semiconductor structures and materials to provide further protection to underlying material while allowing complete mask removal.

In order to accomplish these and other objects of the invention, a mask structure and masking method are provided by depositing a material layer on a material surface which provides an interface selected from the group consisting of a chemical reaction interface, a grain interface and a material interface and provides increased resistance to semiconductor manufacturing processes and increased selectivity of an etching process to the material surface, lithographically patterning the material layer, and removing the material layer from the material surface selectively to the material surface.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
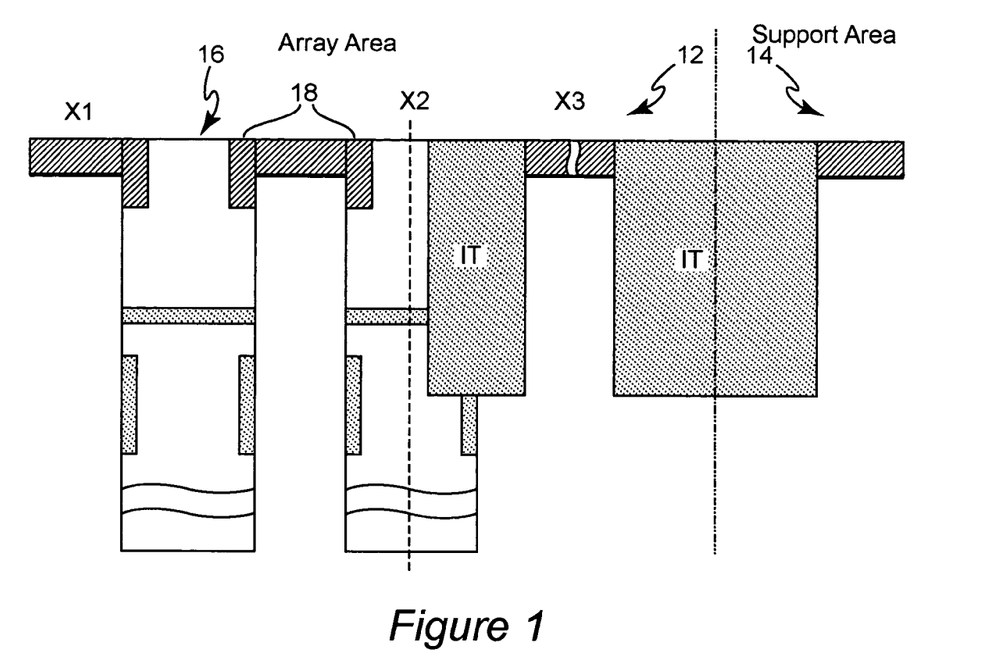
FIGS. 1 and 2 are a cross-sectional view and plan view, respectively, of a memory array structure integrated with other circuitry as a exemplary and representative environment to which the invention is applicable.
Figure 2:
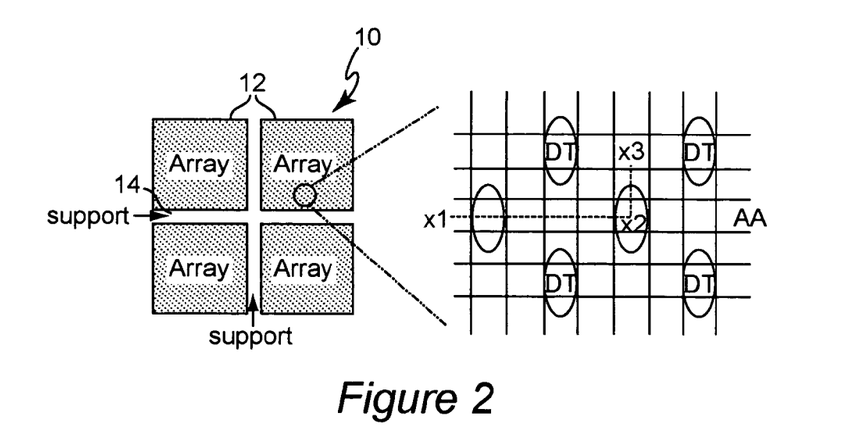

Referring now to the drawings, and more particularly to FIGS. 1 and 2, there is shown an exemplary environment for application of the invention. While the invention is not included in FIGS. 1 and 2, The structure illustrated is arranged to facilitate an understanding of the application of the invention, particularly in regard to semiconductor device fabrication and no portion of either Figure is admitted to be prior art in regard to the present invention. The structure in FIGS. 1 and 2 is principally representative of a memory structure having two major areas: an array area 12 populated by closely spaced memory cells 16 and a support area 14 containing, for example, addressing selection (which may include, for example, a decoder and circuits for substitution of redundant portions of the array) and sense amplifier circuits. It should be understood that the structure could also represent a logic processor (corresponding to the support area) and an embedded memory (corresponding to the array area) such as dynamic random access memory (DRAM), flash memories, or phase-change chalcogenide or ferroelectric embedded memory arrays. It should also be understood that such a memory or logic processor is intended to be exemplary and representative of any chip having plural areas which must be processed differently to, for example, separately optimize individual devices therein and where a block-out mask would be employed to protect one area while processing of another area is carried out. Such different processed areas are presented by NFETs with PFETs in logic, embedded flash memories with logic and radio frequency (RF), SiGe or bipolar devices with FETs and many other combinations of devices which will be evident to those skilled in the art.

As shown in FIG. 2, the memory 10, in plan view, may include a plurality of array areas 12 with support areas 14 between and adjacent to and/or surrounding them. The individual memory cells 16 (in this case, deep trench (DT) capacitor memory cells) are arranged in a pattern of rows and columns with an offset between memory cells of adjacent rows and columns. Isolation trench structures (IT) are employed at the boundary of the array area(s) and also within the array between the individual memory cells 16 as depicted in the sectional view of FIG. 1 along the section indicated by dashed line X1, X2, X3 of FIG. 2; the relative positions of which are also indicated in FIG. 1. FIG. 1 depicts an intermediate stage of processing in which the DT and IT structures (in this case) or, more generally, devices for a given area, have been formed and the surface has been planarized for subsequent lithographic processes in the same or another area of the chip.

Referring now to FIGS. 3-9, a first preferred embodiment of the invention will now be discussed. This embodiment exploits a class of materials containing carbon, silicon and hydrogen with optical properties suitable for use as an anti-reflective coating (ARC) in optical lithographic processes and generically referred to as tunable, etch-resistant anti-reflective coating or TERA. These materials, especially when deposited by chemical vapor deposition (CVD) are generally more chemically inert than resists or other semiconductor materials as alluded to above but, as the inventors have discovered, can be oxidized or, more generally, converted or hydrated with a dry chamber plasma process and subsequently removed by a wet etch using hydrogen fluoride (HF) in a hygroscopic fluid material, preferably an organic solvent such as ethylene glycol or an inorganic acid such as sulfuric acid ($H_2SO_4$) in a two-step process with extremely high selectivity to underlying layers such as silicon, polysilicon, silicon nitride and oxides of silicon or other materials (a property not exhibited by other known ARC materials) while being affected very little, if at all, by other processes and etchants. By the same token, these materials can also be patterned using an extremely thin layer of resist which can be litho-graphically patterned at high resolution and very small minimum feature size well below 100 nm using the same wet etch process. Therefore, TERA material can be used to provide a robust, high resolution hard mask of non-critical and potentially small thickness and with little complication of processes otherwise required for manufacture of a given integrated circuit design.

More specifically, the selectivity of TERA to etching with hydrogen fluoride (HF, as distinguished from hydrofluoric acid, formed by an aqueous solution of hydrogen fluoride and water in which the hydrogen and fluorine ions are dissociated) derives from a conversion or hydration process of the TERA film by creating a plasma of $O_2$, $H_2$ and/or water such that there is a high concentration of $OH^-$ (hydroxyl) groups or water in the plasma which will be incorporated into the TERA film as a water content. The TERA film has lower density and higher permeability than other semiconductor materials and films, including conventional resists (allowing the TERA to be patterned at high resolution, enhanced by its anti-reflective properties), and the incorporation of water or hydroxyl groups in a highly energetic and gaseous form is thus highly preferential to the TERA film. However, other materials having similarly low density and high permeability (and generally inert to semiconductor processing materials) may exhibit similar properties both in regard to conversion/hydration and etching with a mixture of HF and a hygroscopic organic solvent or inorganic acid and thus be suitable for use in the practice of the invention. Hydroxyl groups and smaller atoms or molecules such as hydrogen will also tend to permeate the TERA film more rapidly and uniformly than water due to their smaller size. However, OH$^-$ hydroxyl groups incorporated into the film appear to recombine with incorporated hydrogen to form water to hydrate the TERA film more or less uniformly throughout the film (e.g. with sufficient uniformity to support the selective etching described below).

Similar hydration of a TERA film cannot be achieved by soaking in liquid water; possibly due to the lower density and greater permeability of a TERA film to the smaller hydrogen ions/molecules and hydroxyl groups relative to molecular water and/or the lower energy state of a liquid or vapor relative to a plasma. Further, oxidation of TERA materials in an $O_2$ plasma alone will also convert the film to an oxide and affect the etch characteristics of the material but does not develop as significant a selectivity relative to oxides of other materials, nitrides or other materials commonly used in semiconductor integrated circuits. It should be noted that $CF_4$ and other fluorine-containing materials in the plasma will interfere with the desired conversion process since they suppress the formation of OH$^-$ groups and thus cause the conversion process to lose effectiveness for developing high etch selectivity.

As is known by those skilled in the art, hydrofluoric acid is highly active, chemically, and is a commonly used etchant in semiconductor manufacture such as for tailoring oxide thickness in semiconductor processing. However, such chemical activity is largely due to the individual activities of the dissociated hydrogen and fluorine ions. A high degree of dissociation will occur in the presence of water, even in minute quantities. Non-dissociated HF, however, exhibits little or no etching activity and will not etch oxide, nitride or silicon.

The ability of converted TERA to be etched with HF in an organic or hygroscopic solvent derives principally from the conversion/hydration process described above in which OH$^-$ groups are incorporated into the TERA material and provides water as a by-product of the etching process. This evolved water allows the local dissociation of HF to cause etching of the TERA film selectively to other films on the wafer since the evolved water will be rapidly bound by the organic or hygroscopic solvent which is preferably abundant in the mixture used for etching TERA as the evolved water diffuses into the etching mixture. (Statistically, a vanishingly small amount of dissociation of HF will be present even when water is not present or otherwise bound by other materials such as an organic or hygroscopic solvent. Accordingly, a non-zero amount of etching activity of HF will occur at the surface of the films (including TERA) on the wafer; allowing significant etching to proceed when water is evolved but effectively halting the etching process when water is not produced by the etching process or bound by the relative abundance of organic/hygroscopic material.) For example, ratios of 125:1 and 250:1 of ethylene glycol (a principal component of automotive anti-freeze) to HF has been found suitable for practice of the invention but such ratios should not be considered as limits for the process since the only necessary condition is that the organic or hygroscopic solvent be able to scavenge the amount of water which is evolved. This particular etching mixture is referred to as HF/EG. The temperature of the process is similarly non-critical and the selective TERA etching process has been successfully carried out over a temperature range of 65° C. to 90° C. with a preferred temperature of about 75° C. but, again, these temperatures should not be considered as limits for the successful practice of the process.

Dissociation of HF only occurs at the interface where water is evolved to cause such dissociation of HF and the amount of dissociation of HF at a very short diffusion distance from that interface is held to a vanishingly small level by the organic or hygroscopic solvent throughout the remainder of the etching mixture. Therefore, the converted TERA may be considered as presenting a chemical reaction interface by providing the necessary materials for dissociation of HF and etching of the TERA by the etching process itself. By the same token, when the converted TERA has been fully removed, there is no source of water to support dissociation at the chemical reaction interface, the dissociation of HF returns to vanishingly small levels throughout the etchant mixture and the etching process stops at the surface of material previously underlying the TERA. In other words, any etching which occurs is self-limited by the amount of water which is evolved and the binding of that water in solution in the organic or hygroscopic solvent while the amount of evolved water may be selectively made large for TERA materials selectively to other materials due to its lower density and higher permeability, at least to hydroxl groups and the etching of TERA made similarly selective to other semiconductor materials by conversion through incorporation of OH$^-$ groups selectively in the TERA while the conversion can be readily controlled by masking with common resists, even if very thin, to support current and foreseeable feature resolution requirements. Therefore, the process of etching TERA with HF in an organic or hygroscopic solvent is highly selective to virtually all other materials commonly used in semiconductor device fabrication.

Accordingly, it is seen that a single, relatively thin layer of TERA (or Graded TERA) can provide highly effective and robust masking that is largely impervious to other semiconductor manufacturing processes and yet can be completely removed with extreme selectivity to virtually all other materials used to form semiconductor device structures. Any other materials which may be attacked by HF in an organic or hygroscopic solvent can be protected by a pad layer of oxide, nitride or silicon/polysilicon, as alluded to above, to function as an etch stop and which can then be removed selectively to underlying materials. It should be understood that additional layers such as nitride or polysilicon may also be used in the normal manner above the TERA layer for additional protection during processes which may attack TERA in a non-selective manner.

Figure 3:
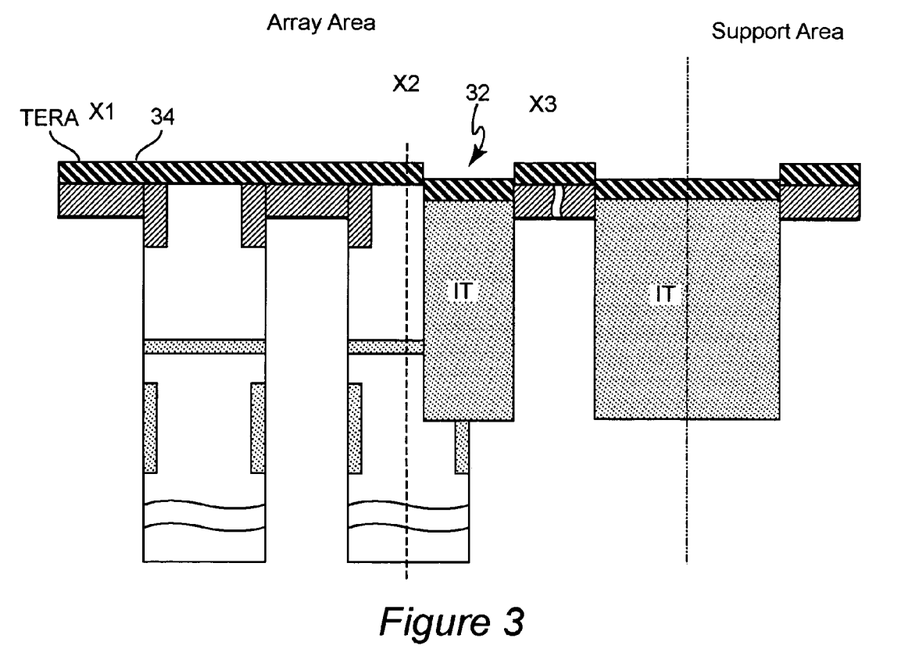
FIGS. 3, 4, 5, 6, 7, 8 and 9 are cross-sectional views illustrating a first embodiment of the invention and its application and use as a hard mask during semiconductor integrated circuit manufacture.

Referring now to FIGS. 3-9, use of a hard mask of TERA materials will now be described. As depicted in FIG. 3, the structure below the hard mask structure in accordance with a first preferred embodiment of the invention is similar to that shown in FIG. 1. However, an optional further deglazing step, preferably with a wet etch has been performed which serves to recess the isolation trench structures IT to a desired height, as illustrated at 32. A preferably isotropic layer 34 of TERA is then deposited on the surface of the chip.

Figure 4:
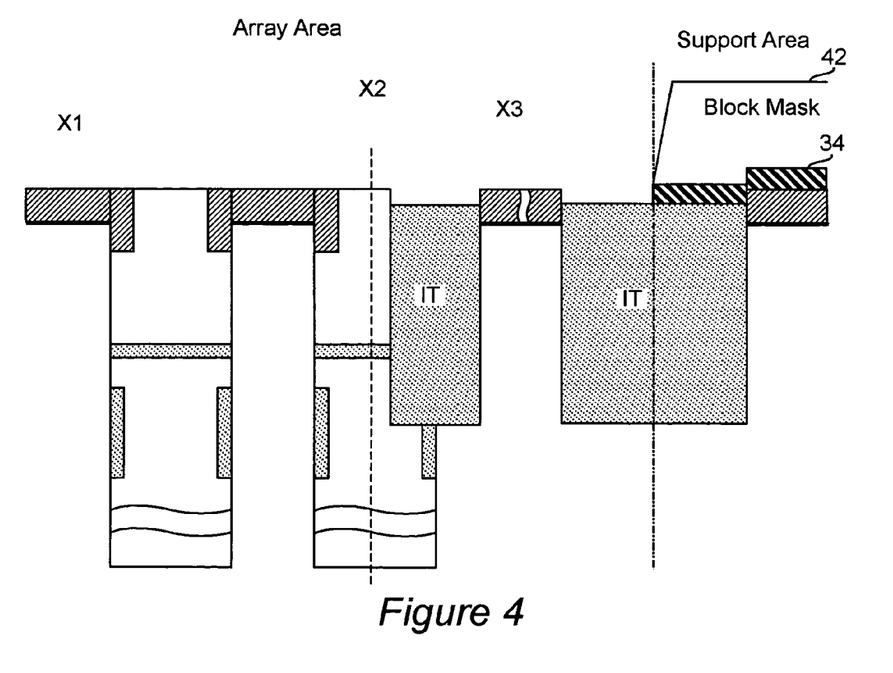
Figure 5:
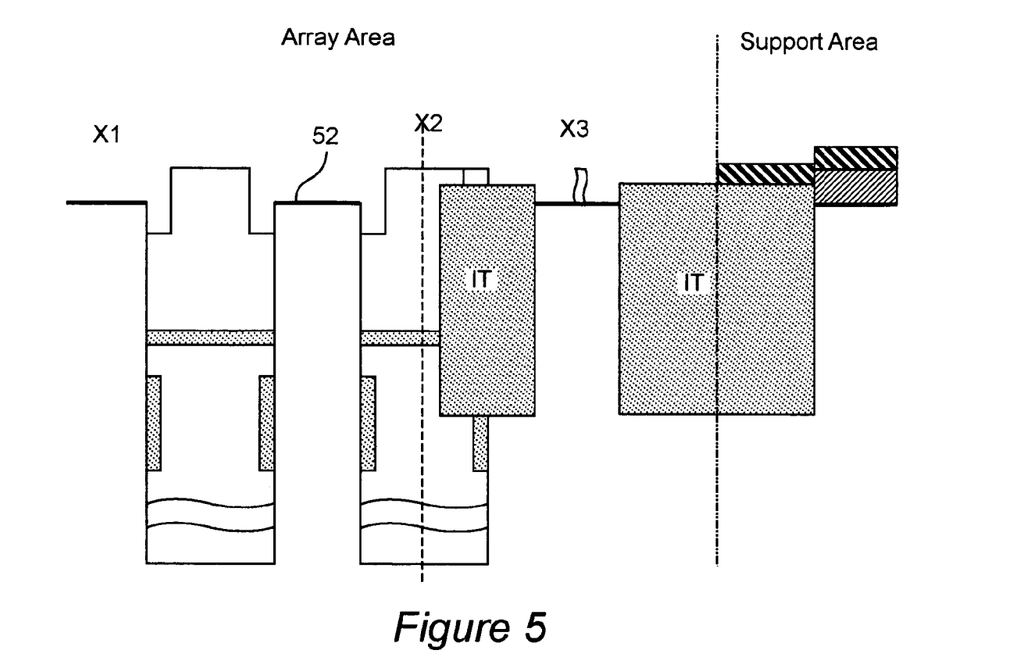

Then, as shown in FIG. 4, a block-out mask 42 (e.g. of resist) which may be on the order of 1.0 μm thick is applied and lithographically patterned. The TERA layer 34 may then be selectively converted and etched as described above to remove the TERA layer from the region or area to be processed while leaving a TERA hard mask on the area to be protected, for example by stripping of pad nitride (including spacers 18), pad oxide and regrowing the pad oxide 52 in the array area while the TERA hard mask protects the support area, as illustrated in FIG. 5. Incidentally, while it is not generally preferred to do so, the patterned resist 42 may be left in place during such processes as additional protection but, as alluded to above, the resist is insufficient or inappropriate to provide protection and is generally removed incident to such processes before completion thereof, as depicted. It also should be understood that other processes may be used, as needed, in accordance with the integrated circuit design being manufactured.

It should be noted, in this regard, that in practice, removal of the resist either intentionally or through erosion by other processes causes some uncontrolled oxidation of the surface of the TERA material to occur; the latter being less controllable than the former. For that reason, it is particularly preferred to use a so-called Graded TERA, alluded to above, in which the oxygen content is gradually increased with thickness of the TERA layer as it is deposited in order to have oxidized TERA of known properties throughout the TERA layer.

Figure 6:
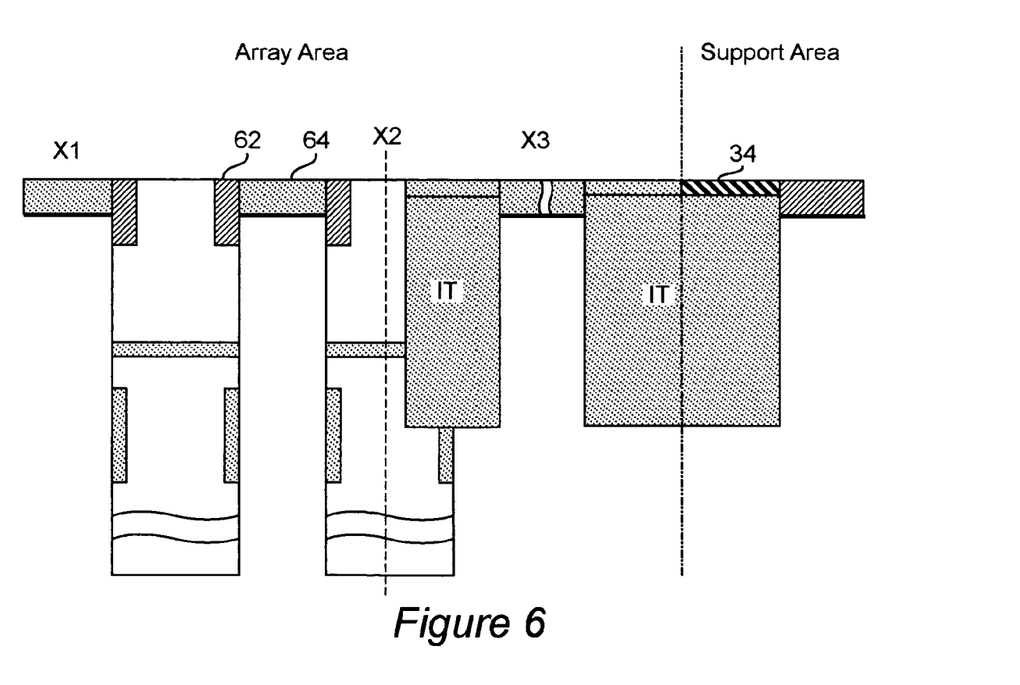
Figure 7:
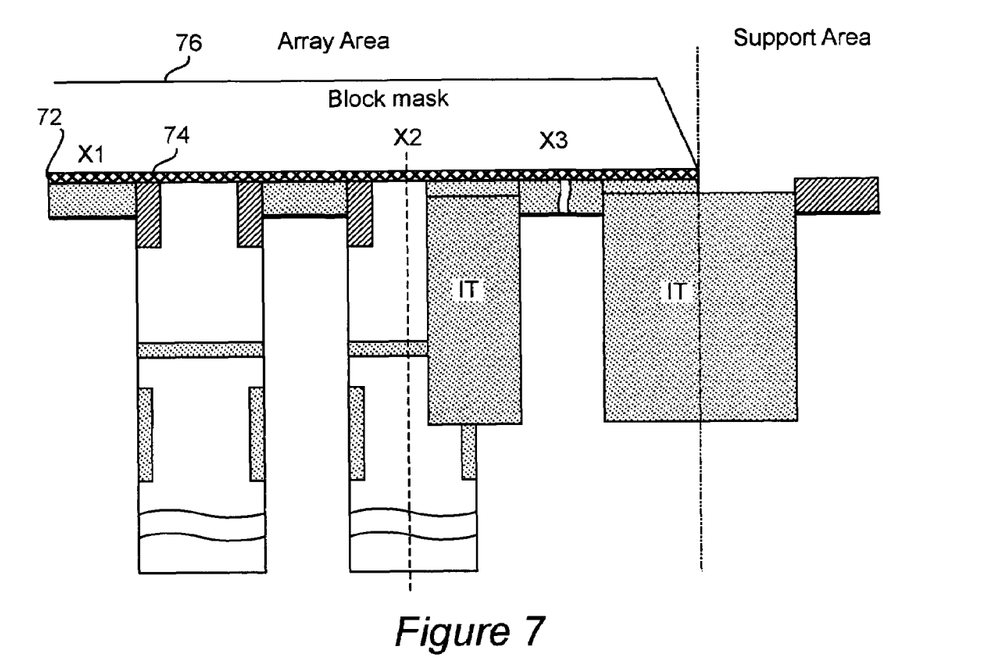
Figure 8:
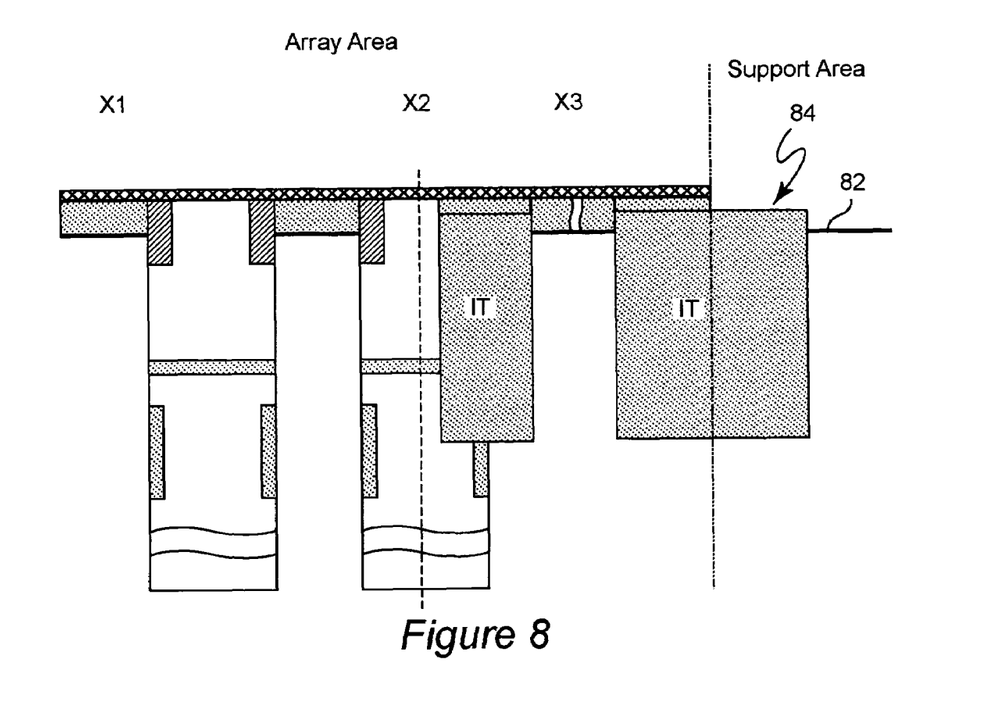
Figure 9:
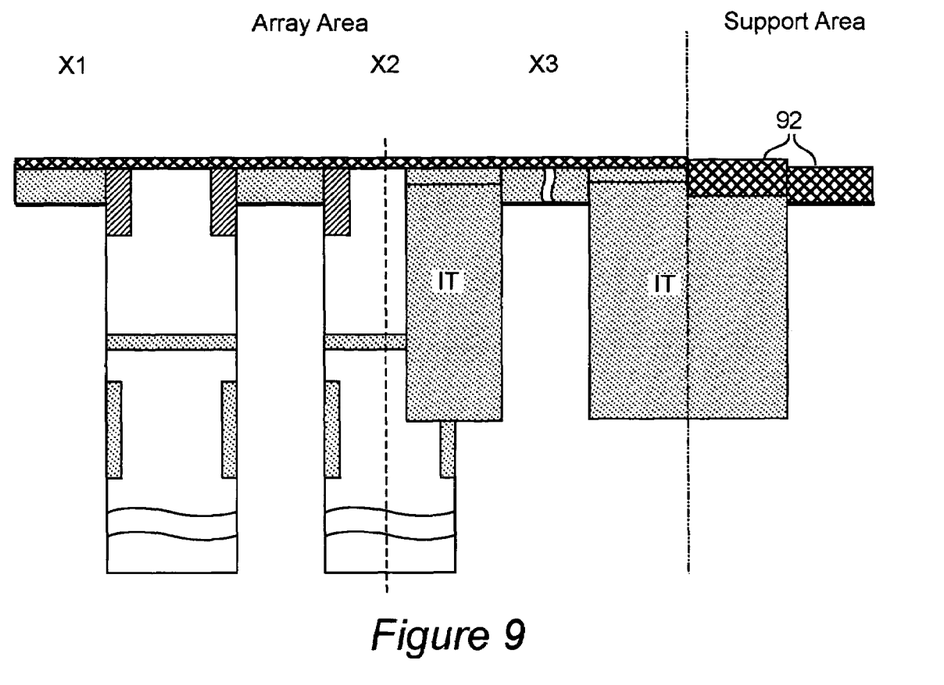

FIG. 6 shows additional processes such as spacer (62) deposition and etch, array implants array top oxide (ATO) 64 deposition and finally planarization, such as by chemical/mechanical polishing (CMP), which may leave the TERA material 34 in the support area. Then, as shown in FIG. 7, TERA layer 72 is deposited and block-out mask 76 is applied and the block-out mask pattern (in this case, exposing the support area) is transferred to the TERA layer to form hard mask 74. Remaining TERA 34 in the support area may be removed, if desired (and as illustrated), by an additional conversion/hydration process while the array area is masked by block-out resist mask 76. Additional support area processes such as etching the IT oxide to a desired height (e.g. as shown at 84), stripping the pad nitride and pad oxide, sacrificial oxide growth, support implants, gate oxide 82 and polysilicon deposition 92 and etching are performed in the support area while the TERA hard mask provides robust protection for the array area, as shown in FIGS. 8 and 9. Again, the resist, if allowed to remain when these processes are begun, does not normally survive them. Then, remaining TERA material can be removed by the two-step conversion/hydration plasma process followed by etching with HF in a hygroscopic or organic solvent mixture and word and bit line formation in the array area with connections to devices in the support area are formed.

Figure 10:
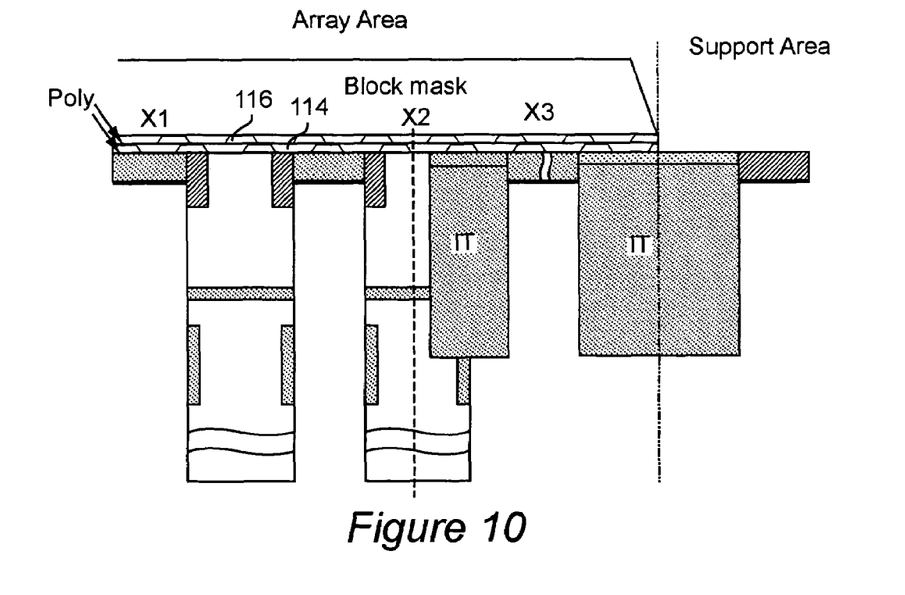
FIG. 10 is a cross-sectional view of a second embodiment of the invention.
Figure 11:
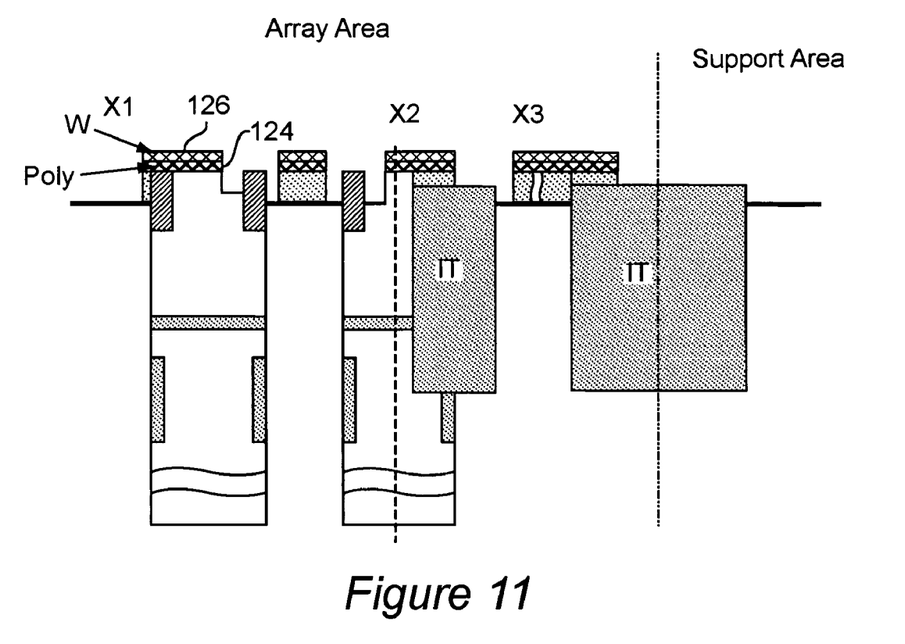
FIG. 11 is a cross-sectional view of a third embodiment of the invention.

Referring now to FIG. 10, a second preferred embodiment of the invention will be described. The second embodiment is similar to the first embodiment except that two layers of polysilicon, for which selective etching processes are well-known, are used instead of the single layer of TERA to obtain increased protection for underlying semiconductor material. While forming a hard mask of polysilicon is known, the inventors have discovered that a polysilicon mask can be made more robust by forming two sequential layers in a manner in which grain boundaries do not extend between the layers. Such a structure may be accomplished by breaking the vacuum after the first layer 114 is deposited and prior to deposition of the second layer 116, as shown in FIG. 11. The interface between the layers thus prevents a continuous grain boundary extending through the two polysilicon layers and thus forms a grain interface which inhibits the initiation of etching processes along grain boundaries through the interface. As is known grain boundaries may become weak spots due to thermal grooving and material diffusion and preferential etching may occur along grain boundaries. However, any such effects are interrupted by the interface formed by the formation of two layers and enhanced protection for underlying material is provided even when the overall thickness of polysilicon in the hard mask layer is not increased. The effect may be enhanced by incidental (or intentional) oxidation, nitridization or surface adsorption of ambient gases when the vacuum is broken or reduced. Thus, additional protection from semiconductor processing is provided while allowing the hard mask to be potentially thinner than a single polysilicon layer and yet allowing the mask structure to be readily removed with high selectivity to underlying materials by known selective etching processes. As with the first embodiment, additional protective layers may also be provided if needed in view of particular process sequences.

In a similar manner, a protective grain boundary can be established by use of dissimilar materials such as polysilicon and a metal in the two layers 124, 126, forming a material interface in accordance with a third preferred embodiment of the invention as shown in FIG. 11. The second layer 126 will also generally be polycrystalline and contain grain boundaries but the difference in crystal structure and/or lattice size will prevent grain boundaries from extending through both layers while the difference in chemical properties of the dissimilar materials will preferably support etching selective to each other or at least selectivity to the underlying material. As with the second embodiment, the total thickness need not exceed the thickness of conventional hard masks while increased protection is provided. Also, as with the second embodiment, the decreased thickness of the individual layers will allow a more controllable removal of the hard mask (since at least a shorter duration etch is required for removal of the reduced thickness of the first layer).

Figure 12:
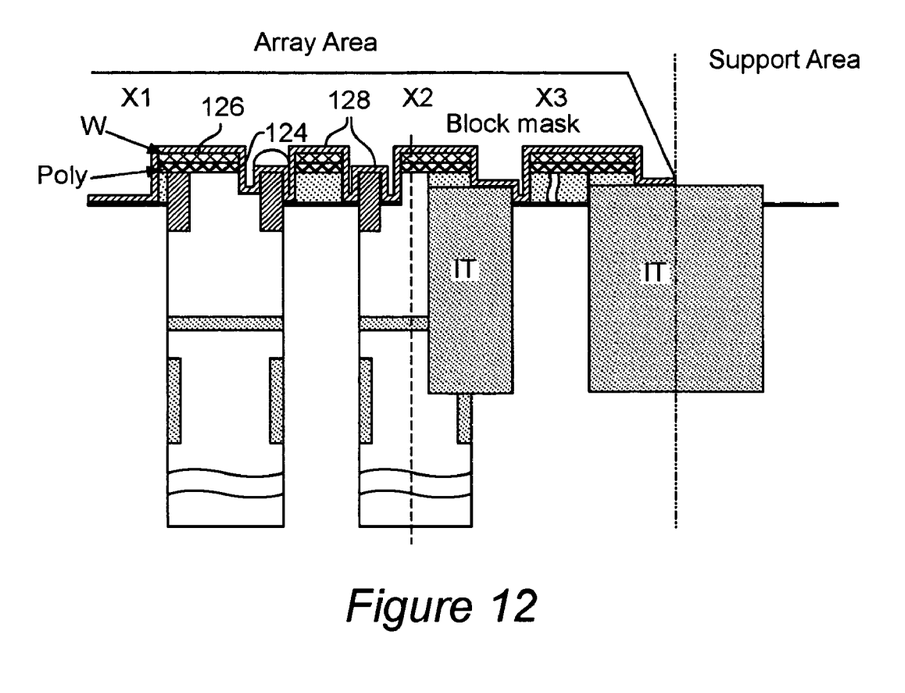
FIG. 12 is a cross-sectional view illustrating additional processing in accordance with the third embodiment of FIG. 11.

This type of structure can be readily patterned, as shown within the array and/or support areas, respectively, preferably using a deep ultraviolet (DUV) resist exposure. This embodiment is particularly useful since the combination of metal, preferably tungsten, and polysilicon layers can be patterned and partially left in place as a gate conductor or other conductive structure (and a silicidation process performed, if desired) whereas the second embodiment cannot be used in such a manner through additional application of metal due to oxidation at the grain interface, as discussed above. Support area devices can be formed after covering the array area with a nitride liner 128 as illustrated in FIG. 12. As with the second embodiment the dissimilar materials in the respective layers not only prevent a continuous grain boundary extending through the hark mask structure and provide a protective grain interface but also act as an etch stop during mask removal to facilitate the complete removal of the mask or patterning to form structures such as transistor gates to be left in the integrated circuit by known selective etch processes.

The mechanism providing increased mask robustness of the third embodiment can also be realized with an additional or alternative material formation. That is, by depositing a layer of semiconductor material (e.g. polysilicon) or metal and performing an oxidation, nitridation or silicidation process, a material interface providing enhanced protection from semiconductor manufacturing processes and an effective etch stop between materials which may be etched selectively to each other and to underlying materials is achieved. Preferred materials include materials selected from tunable etch-resistant anti-reflective coating (TERA) material, TERA material and polysilicon or nitride, a metal and polysilicon, oxidized polysilicon, nitridized polysilicon and silicided metal. Therefore, masks formed in this manner also provide increased levels of protection while being completely removable in a manner selective to the underlying materials. Accordingly, these variants of the third embodiment provide improved masking functions by exploitation of an additional material formation to provide a material interface effect in much the same manner as a chemical reaction interface or a grain interface preventing a continuous grain boundary extending through the structure enhances the masking functions of the first and second embodiments, respectively.

In view of the foregoing, it is seen that the structures in accordance with the invention provide enhanced protection of underlying semiconductor materials from semiconductor device manufacturing processes or during removal thereof or both. Structures in accordance with the invention can be readily patterned using known resists which are sufficiently thin to support lithographic exposure resolution of current and foreseeable minimum feature sizes and the protective structure can also be made very thin (e.g. less than 40 nm) while providing robust protection and which can be completely and reliably removed with high selectivity to and protection of underlying semiconductor materials.

While the invention has been described in terms of three preferred embodiments and variations thereon, those skilled in the art will recognize that the invention can be practiced with modification within the spirit and scope of the appended claims.

The invention claimed is:

1. A method of protecting a material surface comprising steps of
    depositing a material layer on said material surface, said material layer providing a chemical reaction interface at a surface of said material layer,
    lithographically patterning said material layer, and
    removing said material layer from said material surface selectively to said material surface, wherein said material layer provides a chemical reaction interface and is formed of a low density and high permeability material relative to other semiconductor materials and wherein said depositing step includes
    converting said material layer using a plasma containing hydrogen and oxygen or water vapor.

2. A method as recited in claim 1, wherein said removing step includes
    etching said material layer with a mixture of hydrogen fluoride and a hygroscopic material at a chemical reaction interface.

3. A method as recited in claim 2, wherein said low density and high permeability material is a tunable etch-resistant anti-reflective coating (TERA) material.

4. A method as recited in claim 2, wherein said hygroscopic material is an organic solvent or an inorganic acid.

5. A method as recited in claim 4, wherein said organic solvent is ethylene glycol.

6. A method as recited in claim 4, wherein said inorganic acid is sulfuric acid.

7. A mask structure for semiconductor device manufacture comprising
    a layer of material providing a chemical reaction interface at a surface of said layer of material,
    wherein said chemical reaction interface provides enhanced selectivity of an etching process for removal of said layer of material.

8. A mask structure as recited in claim 7, wherein said layer of material has $OH^-$ groups or water incorporated therein.

9. A mask structure as recited in claim 8, wherein said layer of material is a tunable, etch-resistant anti-reflective coating material.

10. A mask structure as recited in claim 7, wherein said layer of material includes hydrated or oxidized tunable etch-resistant anti-reflective coating (TERA) material or graded TERA material.

* * * * *